US00RE49723E

(19) United States
(12) Reissued Patent
Barrass et al.

(10) Patent Number: US RE49,723 E
(45) Date of Reissued Patent: Nov. 7, 2023

(54) POWER ELECTRONICS ASSEMBLY

(71) Applicant: Sevcon Limited, Gateshead (GB)

(72) Inventors: Peter Barrass, Gateshead (GB); Matt Jackson, Gateshead (GB)

(73) Assignee: Turntide Technologies, Inc., Sunnyvale, CA (US)

(21) Appl. No.: 17/338,794

(22) Filed: Sep. 21, 2021

Related U.S. Patent Documents

Reissue of:
(64) Patent No.: 10,736,206
Issued: Aug. 4, 2020
Appl. No.: 15/746,067
PCT Filed: Jul. 27, 2016
PCT No.: PCT/GB2016/052301
§ 371 (c)(1),
(2) Date: Jan. 19, 2018
PCT Pub. No.: WO2017/017448
PCT Pub. Date: Feb. 2, 2017

(30) Foreign Application Priority Data

Jul. 27, 2015 (GB) ..... 1513204

(51) Int. Cl.
*H05K 1/02* (2006.01)
*H05K 1/05* (2006.01)
(Continued)

(52) U.S. Cl.
CPC ..... *H05K 1/0204* (2013.01); *H05K 1/056* (2013.01); *H05K 1/144* (2013.01); *H05K 1/18* (2013.01);
(Continued)

(58) Field of Classification Search
CPC ..... H05K 1/056; H05K 1/18; H05K 1/0204; H05K 3/32; H05K 1/144; H05K 3/368;
(Continued)

(56) References Cited

U.S. PATENT DOCUMENTS 3,652,903 A * 3/1972 Eriksson ..... H01L 23/4006 257/726
3,786,168 A * 1/1974 Jaecklin ..... H01L 23/051 174/16.3
(Continued)

FOREIGN PATENT DOCUMENTS

DE 3630830 A1 3/1988
EP 1056318 A2 11/2000
(Continued)

OTHER PUBLICATIONS

Tin Nanowire Field Effect Transistor—Lida Ansari, Giorgos Fagas and James C. Greer, Tyndall National Institute, University College Cork, Lee Maltings, Dyke Parade, Cork, Ireland—978-1-4673-1708-5/12/S31.00 2012 IEEE—pp.294-297.

*Primary Examiner* — Woo H Choi
(74) *Attorney, Agent, or Firm* — Temmerman Law; Mathew J. Temmerman

(57) ABSTRACT

A power electronics assembly for an electric motor controller. The power electronics assembly comprises an insulated metal substrate, a composite material substrate, and a bolt having a bolt head and a bolt shaft for mechanically coupling the composite material substrate to the insulated metal substrate. The power electronics assembly also includes an electrically conductive sleeve configured to be held between a first electrical contact carried by the insulated metal substrate and a second electrical contact carried by the composite material substrate and the bolt is configured to clamp the composite material substrate to the insulated metal substrate to force the electrically conductive sleeve against the first electrical contact and the second electrical contact.

9 Claims, 5 Drawing Sheets

(51) Int. Cl.

| | |
|---|---|
| ***H05K 1/14*** | (2006.01) |
| ***H05K 1/18*** | (2006.01) |
| ***H05K 3/32*** | (2006.01) |
| ***H05K 3/36*** | (2006.01) |
| *H05K 3/00* | (2006.01) |

(52) U.S. Cl.
CPC ..... *H05K 3/32* (2013.01); *H05K 3/368* (2013.01); *H05K 1/0209* (2013.01); *H05K 3/0061* (2013.01); *H05K 2201/042* (2013.01); *H05K 2201/066* (2013.01); *H05K 2201/10409* (2013.01); *H05K 2201/10598* (2013.01); *H05K 2201/2036* (2013.01)

(58) Field of Classification Search
CPC ..... H05K 2201/10409; H05K 2201/2036; H05K 2201/066; H05K 3/0061; H05K 1/0209; H05K 2201/10598; H05K 2201/042
See application file for complete search history.

(56) References Cited

U.S. PATENT DOCUMENTS

| | | | | |
|---|---|---|---|---|
| 5,018,982 | A | 5/1991 | Speraw et al. | |
| 5,715,141 | A | 2/1998 | Karlsson | |
| 5,940,273 | A * | 8/1999 | Fishman | H01L 23/4006 165/185 |
| 6,320,776 | B1 * | 11/2001 | Kajiura | H02M 7/003 361/709 |
| 6,424,026 | B1 | 7/2002 | Mangtani | |
| 2006/0039127 | A1 | 2/2006 | West | |
| 2006/0046532 | A1 | 3/2006 | Hjort et al. | |
| 2008/0019111 | A1 | 1/2008 | Zeng et al. | |
| 2010/0195301 | A1 | 8/2010 | Fotherby | |
| 2013/0307359 | A1 * | 11/2013 | Vitello | H02K 3/505 310/71 |
| 2015/0029682 | A1 * | 1/2015 | Kadoya | H05K 9/0039 361/748 |
| 2015/0144376 | A1 | 5/2015 | Taketani | |

FOREIGN PATENT DOCUMENTS

| | | | |
|---|---|---|---|
| EP | 1677389 | A1 | 7/2006 |
| EP | 1865758 | A1 | 12/2007 |
| EP | 2328390 | A2 | 6/2011 |
| EP | 2328391 | A3 | 11/2011 |
| EP | 2328392 | A3 | 11/2011 |
| FR | 2882858 | A1 | 9/2006 |
| GB | 2514333 | A | 11/2014 |
| JP | 08330699 | A | 12/1996 |
| JP | 2012-195374 | A | 10/2012 |
| JP | 2013-213765 | A | 10/2013 |

* cited by examiner

POWER ELECTRONICS ASSEMBLY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

FIELD OF INVENTION

The present invention relates to an electronics assembly, for example a power electronics assembly, for coupling a first circuit board to a second circuit board, and a method of manufacturing an electronics assembly.

BACKGROUND

Power electronics assemblies may find applications in vehicles, for example electric vehicles. Such power electronics assemblies may receive direct current (DC) power and convert DC power into alternating current (AC) power for use in operating an electric motor. These power assemblies may comprise elements of the power electronics that evolve considerable heat when in use.

The present disclosure aims to address technical problems associated with power electronics assemblies that may get hot in use.

SUMMARY

Aspects and examples of the present invention are set out in the claims.

BRIEF DESCRIPTION OF THE DRAWINGS

Aspects of the disclosure will now be described in detail, by way of example only, with reference to the accompanying drawings, in which.

DETAILED DESCRIPTION

The present disclosure makes reference to FIGS. 1 to 6, and relates to a power electronics assembly 100 which comprises a bolt 106 for coupling a composite material substrate (CMS) 101 to an insulated metal substrate (IMS) 103. The power assembly 100 is configured to clamp an electrically conductive sleeve 115 between the CMS 101 and the IMS 103 to electrically couple elements on the CMS 101 to elements on the IMS 103. An electrically insulating sleeve 111 surrounds the bolt 106, and is surrounded by the electrically conductive sleeve 115. The electrically insulating sleeve 111 is also arranged between the CMS 101 and the IMS 103. The electrically insulating sleeve 111 electrically insulates conductive elements on the CMS 101 from the bolt 106, and in some examples, conductive elements on the IMS 103 from the bolt 106. The power assembly 100 is adapted so that electrically conductive portions of the assembly 100 are separated by a distance greater than a predetermined distance. Embodiments of the disclosure have particular usefulness in vehicles, although other uses are envisaged.

Figure 1:
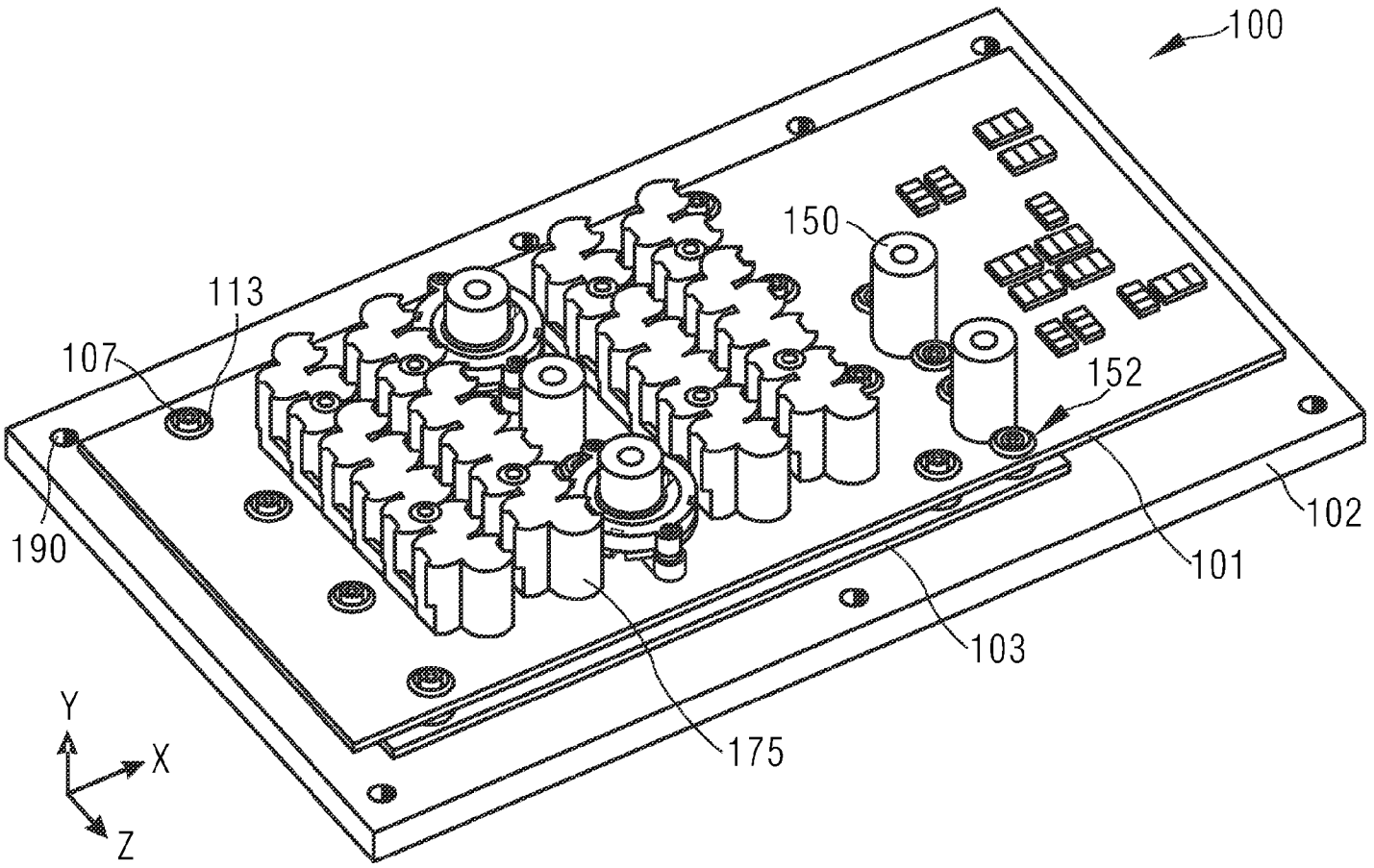
FIG. 1 shows a perspective view of a power electronics assembly for an electric vehicle shown in FIG. 1.
Figure 2:
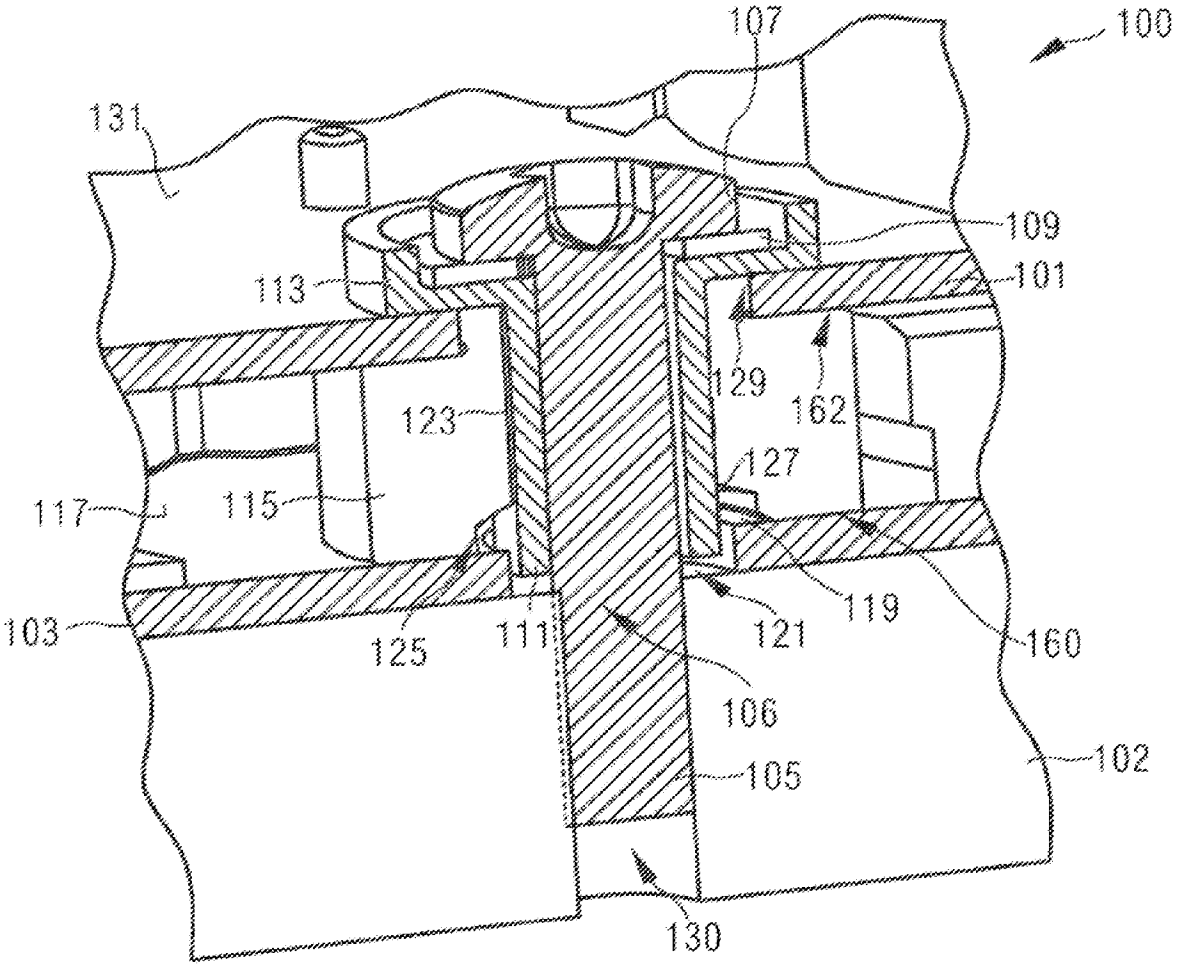
FIG. 2 shows a cross-section through a portion of the power electronics assembly shown in FIG. 1.

As shown in FIGS. 1 and 2, power electronics assembly 100 comprises a CMS 101 and an IMS 103. The IMS 103 is coupled to a heat sink 102. The IMS 103 carries a first printed circuit board that comprises elements of the power electronics such as controllable impedances, for example insulated gate bipolar transistors (IGBTs). The controllable impedances act as an inverter to invert DC current to AC current. The CMS 101 carries a second printed circuit board that comprises elements of the power provider 175 for providing power to be supplied to an electric motor via the controllable impedances, for example capacitors, for example decoupling capacitors or DC capacitors. The elements of the power provider 175 may smooth current and/or voltage ripple and provide power to the elements of the power electronics to be inverted. The elements of the power electronics may evolve considerable heat when in use. Accordingly, the IMS may expand and/or move in use due to thermal expansion. Providing the elements of the power electronics on a separate circuit board to the elements of the power provider 175 may help protect the elements of the power provider 175 from the heat evolved from the elements of the power electronics, and may protect the elements of the power provider 175 from thermal expansion and/or movement due to the thermal expansion.

The CMS 101 and the IMS 103 are arranged parallel to each other with a predetermined stand-off spacing between them. A first electrical contact 160 is provided on the IMS 103 and is electrically coupled to the elements of the power electronics. A second electrical contact 162 is provided on the CMS 101 and is electrically coupled to the elements of the power provider 175. The first electrical contact 160 and the second electrical contact 162 face each other across the stand-off spacing.

The CMS 101 and the IMS 103 are clamped together by a bolt 106. An electrically conductive sleeve 115 surrounds the bolt 106 and is held in the stand-off spacing between, and is electrically coupled to, the first electrical contact 160 of the IMS 103 and the second electrical contact 162 of the CMS 101.

With reference to FIG. 2, the bolt 106 comprises a bolt shaft 105 and a bolt head 107. The bolt head 107 is wider than the bolt shaft 105. The bolt head 107 comprises a female mating portion so that the bolt 106 can be tightened using a tool having a corresponding male mating portion.

Interposed between the bolt 106 and the electrically conductive sleeve 115 is electrically insulating sleeve 111. The electrically insulating sleeve 111 acts as a non-conductive spacer between the bolt shaft 105 and the electrically conductive sleeve 115, and the bolt head 107 and the CMS 101. The electrically insulating sleeve 111 comprises an electrically insulating wall 113 that stands proud of the CMS 101, on a side of the substrate 101 that is opposite to the second electrical contact 162.

The electrically conductive sleeve 115 is generally tubular shaped and is made from a conductive material, for example a metal such as copper, steel or aluminum. The electrically conductive sleeve 115 extends in a longitudinal direction corresponding to the longitudinal direction of the bolt 106 across the stand-off spacing.

The electrically conductive sleeve 115 is configured so that a distance of closest approach between an interior surface of the electrically conductive sleeve 115 and the bolt shaft 105 is at least a first predetermined distance. For example, the first predetermined distance may be at least 0.1 mm, at least 0.2 mm, at least 0.3 mm, at least 0.5 mm, at least 0.7 mm, at least 1.0 mm, at least 1.5 mm, at least 2.0 mm.

As shown in FIG. 2, the electrically conductive sleeve 115 comprises a first internal diameter 123 and a second internal diameter 125. The second internal diameter 125 is greater than the first internal diameter 123. The second internal diameter 125 is selected so that a surface 119 of the IMS 103 is exposed inside the electrically conductive sleeve 115 over at least a second predetermined distance. For example, the second predetermined distance may be at least 0.1 mm, at least 0.2 mm, at least 0.3 mm, at least 0.5 mm, at least 0.7 mm, at least 1.0 mm, at least 1.5 mm, at least 2.0 mm.

The IMS 103 is coated in a layer of insulating material 117, for example a polyamide such as Kapton. The IMS 103 comprises a hole 121 for receiving the bolt 106 therethrough. The internal surface of the hole 121 in the IMS 103 does not comprise a layer of insulating material, and exposes an electrically conductive portion of the IMS 103.

The internal chamfer 127 between the second internal diameter 125 and the first internal diameter 123 of the electrically conductive sleeve 115 is configured to increase the distance of closest approach between the electrically conductive sleeve 115 and the edge of the hole 121 so that it is greater than or equal to the second predetermined distance. The second internal diameter 125 of the electrically conductive sleeve 115 is configured so that, in a longitudinal direction of the electrically conductive sleeve 115, the depth of the second internal diameter 125 is greater than or equal to the second predetermined distance.

The CMS 101 also comprises a hole 129 for receiving the bolt 106 therethrough. The hole 129 in the CMS 101 is wider than the bolt shaft 105 but narrower than the bolt head 107, such that the bolt shaft 105 can pass through the CMS 101 to clamp the CMS 101 to the IMS 103.

The heat sink 102 also comprises a hole or recess 130 for receiving the bolt 106 therethrough. The hole 121 in the IMS 103 is larger than the hole 130 in the heat sink 102. In the example shown in FIG. 2, the hole 129 in the CMS 101 is larger than the hole 121 in the IMS 103, but in the example shown in FIG. 3, the hole 129 in the CMS 101 is smaller than the hole 121 in the IMS 103. The hole or recess 130 in the heat sink 102, and the bolt shaft 105, are threaded, so that the bolt 106 engages and mechanically couples to the heat sink 102.

In the example shown in FIG. 2, the electrically insulating sleeve 111 is at least 0.7 mm thick and is made from a non-compressible material, for example a glass-filled nylon material. In the example shown in FIG. 2, the electrically insulating sleeve 111 has an external diameter that is less than the internal diameter of the hole 121 in the IMS 103 to provide an air gap between the electrically insulating sleeve 111 and an internal side of the hole 121 in the IMS 103.

The electrically insulating wall 113 at least partially surrounds the bolt head 107. In the example shown in FIG. 2, the electrically insulating wall 113 is provided by an electrically insulating cup in which the bolt head 107 is seated when the CMS 101 is clamped to the IMS 103 by the bolt 106. In the example shown in FIG. 2, an internal diameter of the electrically insulating wall 113 is therefore greater than the greatest diameter of the bolt head 107.

The bolt 106 is configured to clamp the CMS 101 to the IMS 103 to force the electrically conductive sleeve 115 against the first electrical contact 160 and the second electrical contact 162 for electrical coupling with the controllable impedances. A clamping force provided by the bolt 106 urges the IMS 103 against the heat sink 102 to thermally couple the controllable impedances to the heat sink 102. The clamping force is transmitted through the electrically conductive sleeve 115.

The electrically insulating wall 113 may be configured so that a distance of closest approach between the bolt head 107 and the surface 131 of the CMS 101 is at least a third predetermined distance. For example, the third predetermined distance may be at least 0.1 mm, at least 0.2 mm, at least 0.3 mm, at least 0.5 mm, at least 0.7 mm, at least 1.0 mm, at least 1.5 mm, at least 2.0 mm.

Any of the first, second, third and fourth predetermined distances may correspond to any of the other first, second, third and fourth predetermined distances. The first, second, third and fourth predetermined distances may be selected to inhibit dielectric breakdown, for example of air or accreted matter, over that distance.

The CMS 101 may comprise, for example a fiberglass material, for example it may be an FR4 board. The IMS 103 may comprise, for example, an aluminum substrate insulated with a layer of a dielectric such as a polyamide, for example Kapton. The CMS 101 may also comprise an insulating layer of dielectric 131, for example polyamide, for example Kapton. In some examples, the IMS 103 is coupled to a heat sink 102, for example a heat sink. The IMS 103 may be coupled to the heat sink 102, for example, via a thermally conductive paste applied to the heat sink 102, and mechanically coupled, for example, via alignment screws 190.

The IMS 103 may also comprise at least one power terminal 150 electrically coupled to the controllable impedances. For example, one power terminal 150 may be coupled to a DC bus, and another power terminal 150 may be coupled to an AC bus. The CMS 101 may further comprise at least one hole 152 for each power terminal 150 to pass therethrough. The CMS 101 and/or the IMS 103 may comprise other functionality which may include, for example, microprocessors, power supplies, capacitors and inductors configured for control filtering and conditioning.

The electrically insulating wall 113 may be configured so that a distance of closest approach between the bolt head 107 and a power terminal 150 projecting through a hole is at least a fourth predetermined distance. For example, the fourth predetermined distance may be at least 0.1 mm, at least 0.2 mm, at least 0.3 mm, at least 0.5 mm, at least 0.7 mm, at least 1.0 mm, at least 1.5 mm, at least 2.0 mm.

The first 160 and/or second 162 electrical contacts may comprise a portion where an insulating layer of dielectric has been removed to expose an electrically conductive surface below. In some examples, a void between the surface 117 of the IMS 103 and the electrically conductive sleeve 115 is filled with an insulating material.

In the example shown in FIG. 2, the bolt 106 is arranged to clamp the electrically conductive sleeve 115 against the first electrical contact 160 to provide a gas tight seal between the electrically conductive sleeve 115 and the first electrical contact 160. In the example shown in FIG. 2, the bolt 106 is also arranged to clamp the electrically conductive sleeve 115 against the second electrical contact 162 to provide a gas tight seal between the electrically conductive sleeve 115 and the second electrical contact 162. In other examples, the bolt 106 is arranged to clamp the electrically conductive sleeve 115 against only one of the first electrical contact 160 and the second electrical contact 162 to provide a gas tight seal with the electrically conductive sleeve 115, or may not be arranged to provide a gas tight seal at all.

In some examples, for example as shown in FIG. 2, the power electronics assembly 100 further comprises a washer 109 interposed between the bolt head 107 and a portion of the electrically insulating sleeve 111 to distribute pressure when the CMS 101 is clamped to the IMS 103 by the bolt 106. In the example shown in FIG. 2, an internal diameter of the electrically insulating wall 113 is greater than an external diameter of the washer 109.

The electrically conductive sleeve 115 may also comprise, as illustrated in FIG. 2, an internal chamfer between the second internal diameter 125 and the first internal diameter 123. In some examples, the first internal diameter 123 of the electrically conductive sleeve 115 corresponds to at least the diameter of the bolt 106 plus twice the thickness of the electrically insulating sleeve 111. A surface 119 of the IMS 103 may be exposed inside the electrically conductive sleeve 115. The electrically insulating sleeve 115 may further comprise a second and/or third internal chamfer. The second and/or third internal chamfers may be at opposite ends of the internal surface of the electrically insulating sleeve 115. For example, the second internal chamfer may be between the second internal diameter 125 and an end of the electrically conductive sleeve 115. The third internal chamfer may be between the first internal diameter 123 and an end of the electrically conductive sleeve 115.

Figure 4:
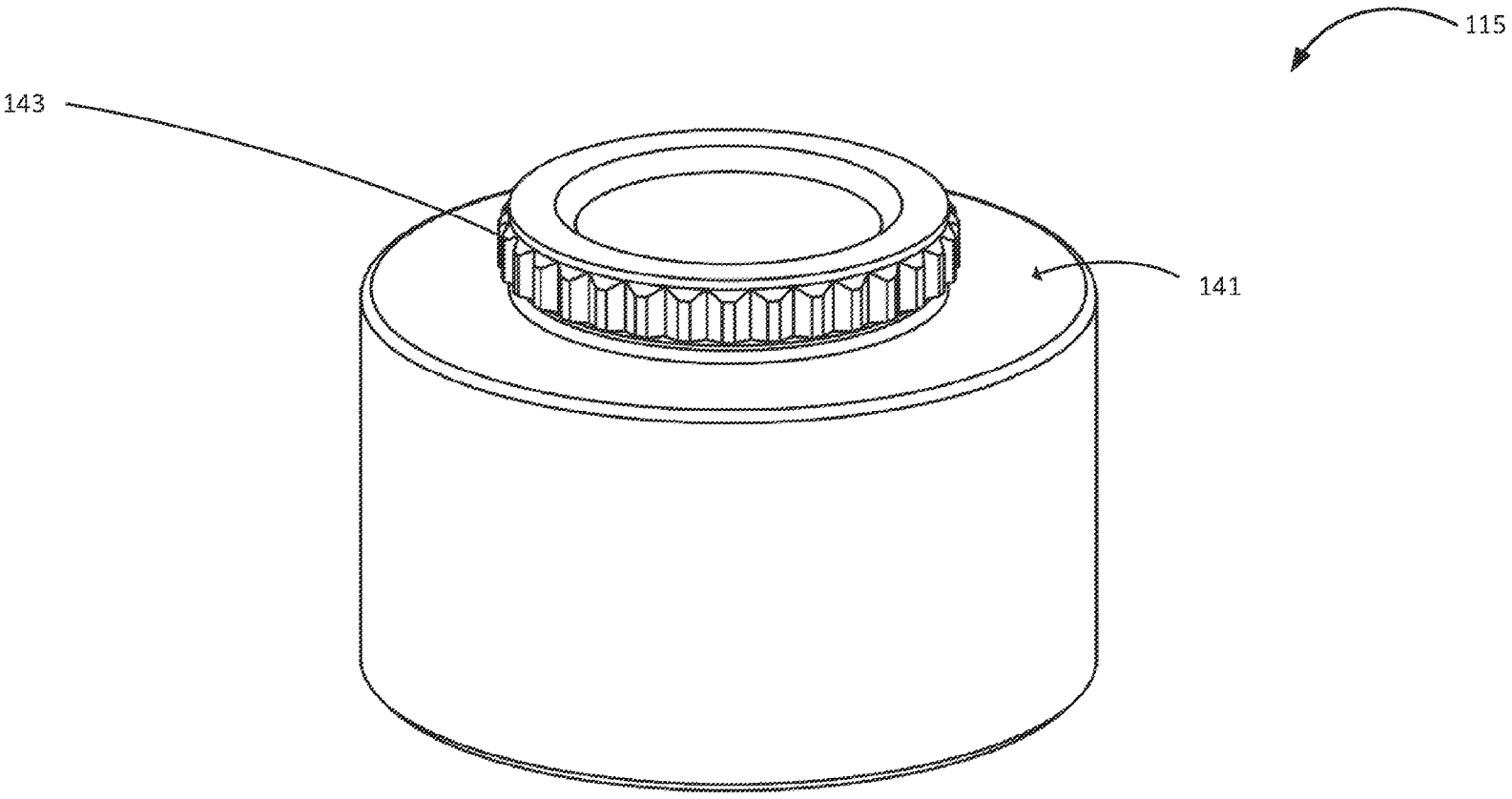
FIG. 4 shows a perspective view of an electrically conductive sleeve for use in a power electronics assembly of any of FIGS. 1 to 3.
Figure 6:
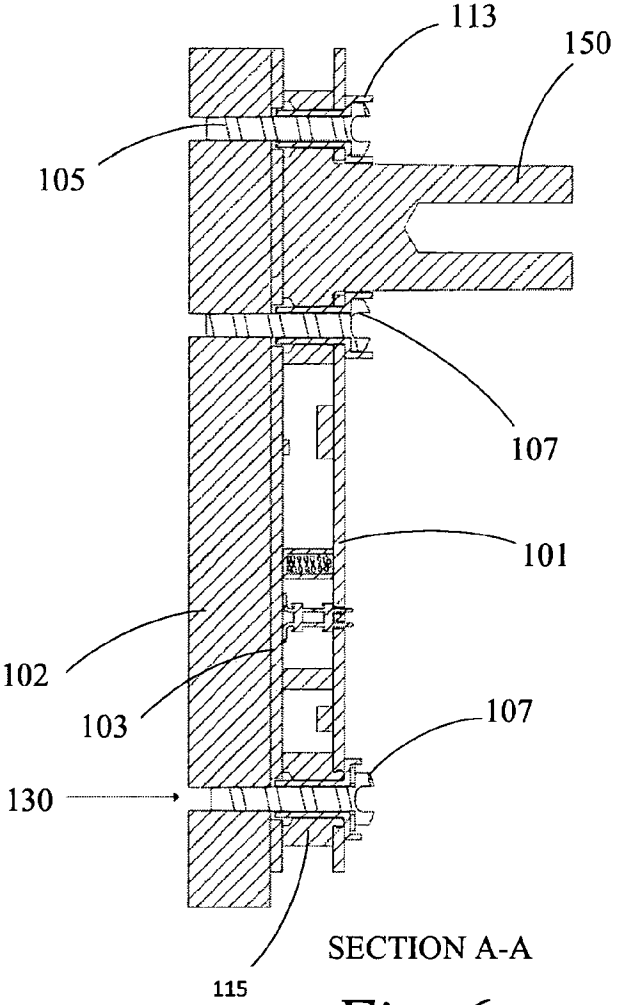
FIG. 6 shows a cross-section along the line A-A shown in FIG. 5.
Figure 5:
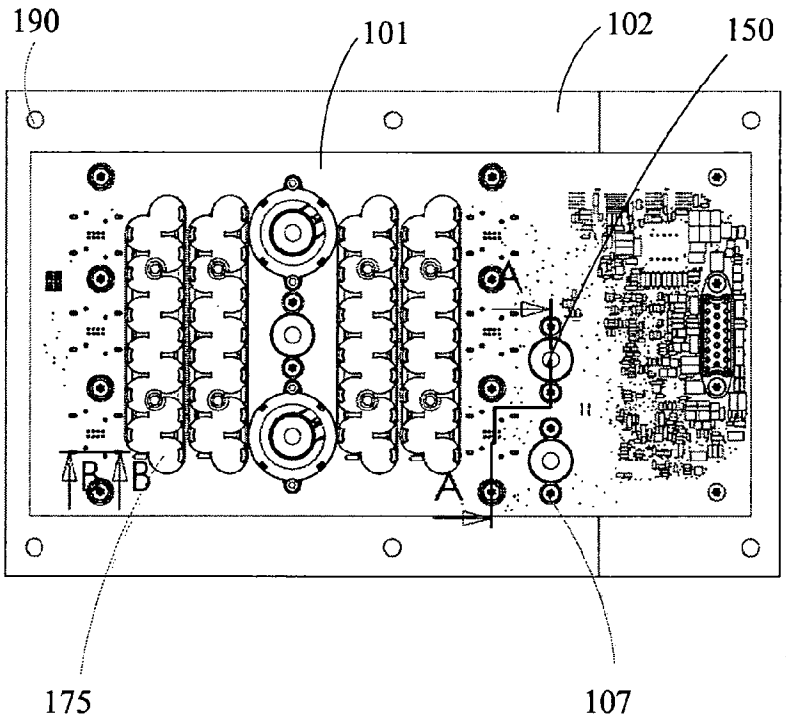
FIG. 5 shows a plan view of the power electronics assembly of FIG. 1.

The electrically conductive sleeve 115 may comprise a portion that extends into the hole 129 in the CMS 101, as described in more detail below with reference to FIG. 4. An example of an electrically conductive sleeve 115 such as this one is shown in more detail in FIG. 4. In the example shown in FIG. 4, the electrically conductive sleeve 115 comprises a portion that extends into the hole 129 in the CMS 101. In the example shown in FIG. 4, the electrically conductive sleeve 115 comprises a portion with a first external diameter and a portion with a second external diameter. The second external diameter is smaller than the first external diameter. Between the portion with the first external diameter and the portion with the second external diameter there is a portion with a surface 141 transverse to the longitudinal direction of the electrically conductive sleeve 115. The portion with the second external diameter comprises means for mechanically engaging with the CMS 101, for example a protruding portion, such as teeth 143.

The teeth 143 on the electrically conductive sleeve 115 are configured to engage with a portion of the CMS 101. For example, the teeth 143 are configured to engage with an interior surface of hole 129 in the CMS 101. The teeth 143 may be configured to press into the CMS 101 to improve the mechanical and electrical contact between the electrically conductive sleeve 115 and the CMS 115. For example, the teeth 143 of the electrically conductive sleeve 115 may be adapted to cut into the CMS 101 when the CMS 101 is clamped to the IMS 103. The interior surface of hole 129 in the CMS 101 may comprise a layer of conductive material, for example a layer of solder that is electrically coupled to the second electrical contact 162 and the elements of the power provider 175. The teeth 143 are configured to press or cut into the layer of solder to improve the electrical contact between the electrically conductive sleeve 115 and elements of the power provider 175 on the CMS 101.

The transverse portion 141 of the electrically conductive sleeve 115 is configured to engage with the second electrical contact 162 on the CMS 101. The electrically conductive sleeve 115 also comprises a corresponding transverse portion on its opposite end to engage with the first electrical contact 160 on the IMS 103.

The electrically conductive sleeve 115 may only partially surround the bolt 106. In some examples the electrically conductive sleeve 115 may comprise a power terminal 150 for coupling to a source of power input or a power output. The power terminal 150 may be adapted to extend through the CMS 101, and the CMS 101 may comprise a corresponding hole 152 for the power terminal 150 to pass therethrough. For example, the power terminal 150 may extend in a longitudinal direction greater than the stand-off spacing between the IMS 103 and the CMS 101, so that the power terminal 150 extends through the corresponding hole 152 in the CMS 101 and beyond a surface of the CMS 101 on a side of the CMS 101 that is opposite to the second electrical contact 162. The power terminal 150 may be configured to be clamped between the CMS 101 and the insulated material substrate 103 by at least two bolts 106, for example on opposing sides thereof.

The electrically insulating sleeve 111 may be at least 0.7 mm thick, at least 0.9 mm thick, at least 1.1 mm thick. The electrically insulating sleeve 111 may be made from a non-compressible material, for example a glass-filled nylon material. The electrically insulating sleeve 111 may have an external diameter that is less than the internal diameter of the hole 121 in the IMS 103 to provide an air gap between the electrically insulating sleeve 111 and an internal side of the hole 121 in the IMS 103. In some examples, the bolt 106 is electrically coupled to the IMS 103 so that, in use, the bolt 106 and the IMS 103 are at the same electrical potential. In these examples, the electrically insulating sleeve 111 may extend into the hole 121 in the IMS 103. The electrically insulating sleeve 111 may extend into the hole 121 in the IMS 103 for a distance less than the thickness of the IMS 103. For example, the electrically insulating sleeve 111 may extend into the hole 121 in the IMS 103 by 0.1 mm, at least 0.2 mm, at least 0.3 mm, at least 0.5 mm, at least 0.7 mm, at least 1.0 mm, at least 1.5 mm, at least 2.0 mm.

Figure 3:
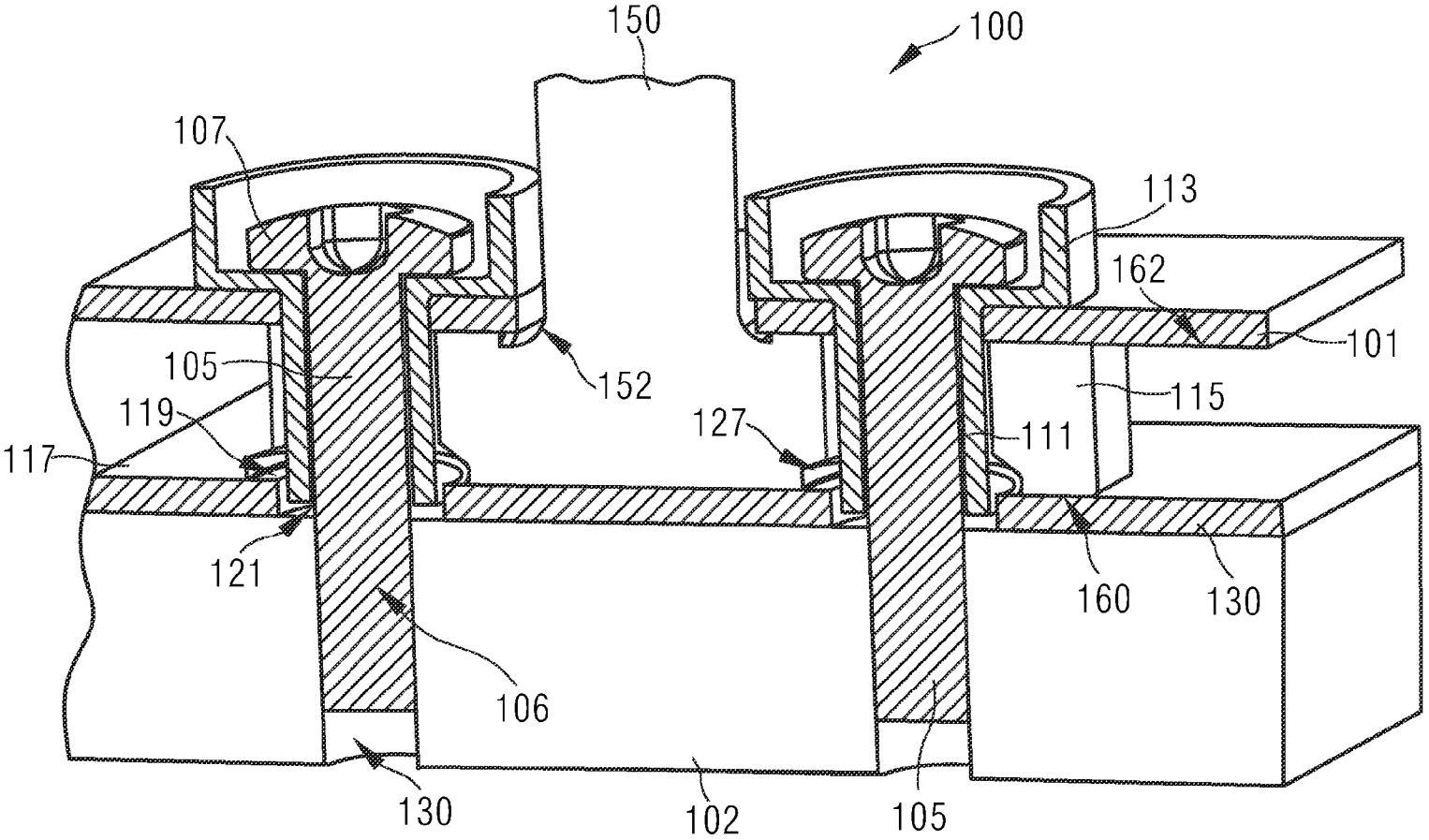
FIG. 3 shows a cross-section through another portion of the power electronics assembly shown in FIG. 1.

In the example shown in FIG. 2, the electrically insulating wall 113 is configured to stand proud of the CMS 101 by a distance greater than that at which the bolt head 107 stands proud of the CMS 101. In some examples, the electrically insulating wall is configured to electrically insulate the bolt head 107 from a power terminal 150, as shown in FIG. 3.

In examples where the electrically insulating sleeve 111 comprises a cup for receiving the bolt head 107, the cup is configured to at least partially surround the bolt head 107 and is shaped to increase an airgap, and thereby inhibit dielectric breakdown, between the bolt head 107 and conductive elements on the CMS 101, for example elements of the power provider 175 and/or conductive debris accumulated on the CMS 101. The cup may also be configured to insulate the bolt head 197 from the power terminal 150, for example the cup may be configured to inhibit dielectric breakdown between the bolt head 107 and the power terminal 150.

A method of manufacturing the power electronics assembly may comprise preparing a heat sink 102 by applying a thermally conductive paste to a surface thereof; coupling an IMS 103 to the surface of the heat sink comprising the thermally conductive paste via at least one alignment screw 190, wherein the IMS 103 carries controllable impedances of the power electronics assembly 100; coupling at least one power terminal 150 to the controllable impedances of the IMS 103; aligning a CMS 101 with the at least one power terminal 150; passing an electrically insulating sleeve 111 through a hole 129 in the CMS 101 and into a corresponding recess or hole 121 in the IMS 103; and mechanically coupling the CMS 101 to the IMS 103 by passing and securing a bolt 106 through the electrically insulating sleeve 111 to clamp the CMS 101 to the IMS 103.

In some examples, the at least one power terminal 150 comprises an electrically conductive sleeve 115, and mechanically coupling the CMS 101 to the IMS 103 comprises clamping the CMS 101 to the IMS 103 via the electrically conductive sleeve 115, for example by forcing the electrically conductive sleeve 115 against a first electrical contact 160 on the IMS 103 and a second electrical contact 162 on the CMS 101.

Other methods of manufacture may also be employed. For example, elements of the power electronics assembly 100, such as the electrically conductive sleeve 115 or the electrically insulating sleeve 111, may be manufactured by way of '3D printing' whereby a three-dimensional model is supplied, in machine readable form, to a '3D printer' adapted to manufacture the/elements of the power electronics assembly 100. This may be by additive means such as extrusion deposition, Electron Beam Freeform Fabrication (EBF), granular materials binding, lamination, photopolymerization, or stereolithography or a combination thereof. The machine readable model comprises a spatial map of the object to be printed, typically in the form of a Cartesian coordinate system defining the object's surfaces. This spatial map may comprise a computer file which may be provided in any one of a number of file conventions. One example of a file convention is a STL (STereoLithography) file which may be in the form of ASCII (American Standard Code for Information Interchange) or binary and specifies areas by way of triangulated surfaces with defined normals and vertices. An alternative file format is AMF (Additive Manufacturing File) which provides the facility to specify the material and texture of each surface as well as allowing for curved triangulated surfaces. The mapping of the/elements of the power electronics assembly may then be converted into instructions to be executed by 3D printer according to the printing method being used. This may comprise splitting the model into slices (for example, each slice corresponding to an x-y plane, with successive layers building the z dimension) and encoding each slice into a series of instructions. The instructions sent to the 3D printer may comprise Numerical Control (NC) or Computer NC (CNC) instructions, preferably in the form of G-code (also called RS-274), which comprises a series of instructions regarding how the 3D printer should act. The instructions vary depending on the type of 3D printer being used, but in the example of a moving printhead the instructions include: how the printhead should move, when/where to deposit material, the type of material to be deposited, and the flow rate of the deposited material.

The power electronics assembly 100 as described herein may be embodied in one such machine readable model, for example a machine readable map or instructions, for example to enable a physical representation of elements of the power electronics assembly 100, such as the electrically conductive sleeve 115 or the electrically insulating sleeve 111, to be produced by 3D printing. This may be in the form of a software code mapping of the antenna and/or instructions to be supplied to a 3D printer (for example numerical code).

Other examples and variations are contemplated within the scope of the appended claims.

What is claimed is:

1. A power electronics assembly for an electric motor controller comprising:

an insulated metal substrate carrying controllable impedances of the power electronics assembly wherein the insulated metal substrate is thermally coupled to the controllable impedances;

a composite material substrate carrying elements of a power provider for providing power to be supplied to an electric motor via the controllable impedances;

a bolt comprising a bolt head and a bolt shaft for mechanically coupling the composite material substrate to the insulated metal substrate;

an electrically conductive sleeve configured to be held between a first electrical contact carried by the insulated metal substrate and a second electrical contact carried by the composite material substrate and to at least partially surround and be held in place by the bolt;

wherein the bolt is configured to clamp the composite material substrate to the insulated metal substrate to force the electrically conductive sleeve against the first electrical contact and the second electrical contact for electrical coupling with the controllable impedances; and an electrically insulating wall extending away from the composite material substrate to define an insulative cavity on a side of the composite substrate that is opposite to the second electrical contact, wherein the bolt head is at least partially contained within the insulative cavity;

wherein the electrically insulating wall is part of an electrically insulating sleeve, and wherein the electrically conductive sleeve comprises a chamfer to expose a surface of the insulated metal substrate between the electrically conductive sleeve and the electrically insulating sleeve.

2. The assembly of claim 1 wherein the electrically insulating wall has a greater internal diameter than a part of the electrically insulating sleeve that surrounds the bolt shaft.

3. The assembly of claim 1 wherein the electrically insulating wall is provided by an electrically insulating cup in which the bolt head is seated when the composite material is clamped to the insulated metal substrate by the bolt.

4. The assembly of claim 1 wherein a distance of closest approach between an interior surface of the electrically conductive sleeve and the bolt shaft is at least a first predetermined distance.

5. The assembly of claim 1 comprising an electrically insulating sleeve arranged between the bolt and the electrically conductive sleeve, wherein the bolt is electrically coupled to the insulated metal substrate so that, in use, the bolt and the insulated metal substrate are at the same electrical potential and the insulating sleeve passes at least partially into the insulated metal substrate around the bolt shaft.

6. The assembly of claim 5 wherein the first internal diameter of the electrically conductive sleeve corresponds to at least the diameter of the bolt plus twice the thickness of the electrically insulating sleeve.

7. The assembly of claim 5 wherein the electrically insulating sleeve has an external diameter that is less than internal diameter of a hole in the insulated metal substrate to provide an air gap between the electrically insulating sleeve and an internal side of the hole.

*8. The assembly of claim 7 wherein the electrically insulating sleeve extends into the hole by at least 0.1 mm.*

*9. The assembly of claim 7 wherein the electrically insulating sleeve has a wall thickness of at least 0.7 mm.*

* * * * *